(12) United States Patent
Tanaka (10) Patent No.: US 10,425,066 B2
(45) Date of Patent: Sep. 24, 2019

(54) MEMORY CIRCUIT AND CONTROL METHOD FOR MEMORY CIRCUIT

(71) Applicant: FUJITSU LIMITED, Kawasaki-shi, Kanagawa (JP)

(72) Inventor: Tomohiro Tanaka, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/972,510

(22) Filed: May 7, 2018

(65) Prior Publication Data

US 2018/0337661 A1    Nov. 22, 2018

(30) Foreign Application Priority Data

May 16, 2017    (JP) .................. 2017-097316

(51) Int. Cl.
*H03K 3/356* (2006.01)
*H03K 3/037* (2006.01)

(52) U.S. Cl.
CPC .................. *H03K 3/037* (2013.01)

(58) Field of Classification Search
CPC ..... G11C 11/41; G11C 11/412; G11C 11/419; G11C 7/12; G11C 7/18
See application file for complete search history.

(56) References Cited

U.S. PATENT DOCUMENTS

2002/0079942 A1 * 6/2002 Proebsting ......... H03K 19/0019
327/277
2008/0164910 A1 7/2008 Kim et al.

FOREIGN PATENT DOCUMENTS

JP    2002-50944    2/2002
JP    2008-172779    7/2008

* cited by examiner

*Primary Examiner* — Sibin Chen
(74) *Attorney, Agent, or Firm* — Fujitsu Patent Center (57) ABSTRACT

A memory circuit includes, a latch circuit that includes a first node, a second node, a first inverter having an input coupled to the first node and an output coupled to the second node, and a second inverter having an input coupled to the second node and an output coupled to the first node, a writing circuit that includes a first transistor coupled to the first node and a second transistor coupled to the second node and executes writing to the latch circuit using the first transistor and the second transistor, a command circuit detects the execution of the writing to the latch circuit and output a command signal to increase the potential of the second node before the termination of the writing of a low level to the first node, and a potential control circuit increases the potential of the second node based on the command signal.

16 Claims, 10 Drawing Sheets

MEMORY CIRCUIT AND CONTROL METHOD FOR MEMORY CIRCUIT

CROSS-REFERENCE TO RELATED APPLICATION

This application is based upon and claims the benefit of priority of the prior Japanese Patent Application No. 2017-97316, filed on May 16, 2017, the entire contents of which are incorporated herein by reference.

FIELD

The embodiments discussed herein are related to a memory circuit and a control method for a memory circuit.

BACKGROUND

Traditionally, a memory circuit is known, which has a latch circuit in which an output of one of inverters is coupled to an input of the other of the inverters and an output of the other of the inverters is coupled to an input of the one of the inverters.

Related techniques are disclosed in Japanese Laid-open Patent Publication Nos. 2008-172779 and 2002-050944.

SUMMARY

According to an aspect of the embodiments, a memory circuit includes, a latch circuit that includes a first node, a second node, a first inverter having an input coupled to the first node and an output coupled to the second node, and a second inverter having an input coupled to the second node and an output coupled to the first node, a writing circuit that includes a first transistor coupled to the first node and a second transistor coupled to the second node and is configured to execute writing to the latch circuit using the first transistor and the second transistor, a command circuit configured to detect the execution of the writing to the latch circuit and output a command signal to increase the potential of the second node before the termination of the writing of a low level to the first node, and a potential control circuit configured to increase the potential of the second node based on the command signal.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
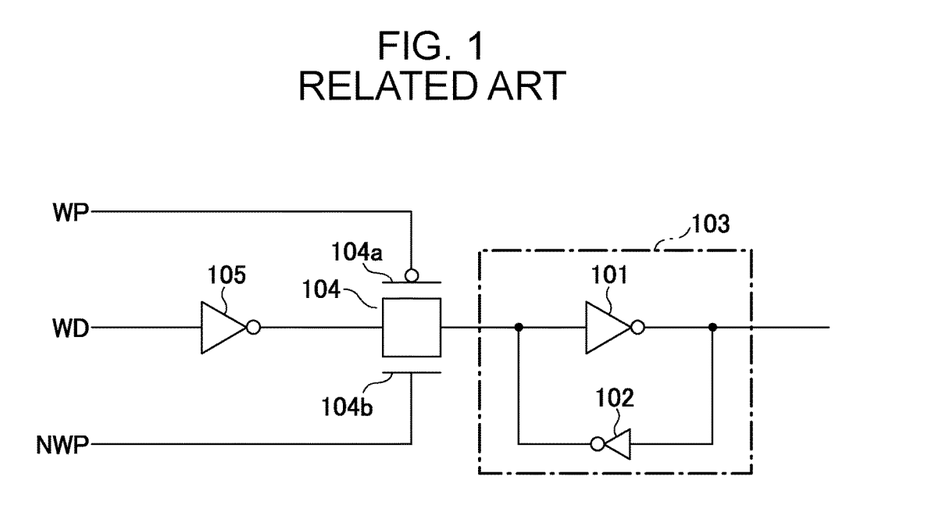
FIG. 1 is a diagram illustrating an example of the configuration of a latch circuit in which a writing section is formed with CMOS logic.

FIG. 1 is a diagram illustrating an example of a memory circuit in which data is written to a latch circuit by a writing section formed with CMOS logic. CMOS stands for Complementary Metal Oxide Semiconductor (MOS). A latch circuit 103 has a configuration in which an output of an inverter 101 is coupled to an input of an inverter 102 and an output of the inverter 102 is coupled to an input of the inverter 101. A transfer gate 104 is a writing section including a pMOS transistor 104a and an nMOS transistor 104b. In this case, p of pMOS indicates a p-channel type, and n of nMOS indicates an n-channel type. In the case where write data WD input to an inverter 105 is written to the latch circuit 103, a memory circuit illustrated in FIG. 1 uses two control lines for transmission of control signals WP and NWP to turn on the pMOS transistor 104a and the nMOS transistor 104b.

Figure 2:
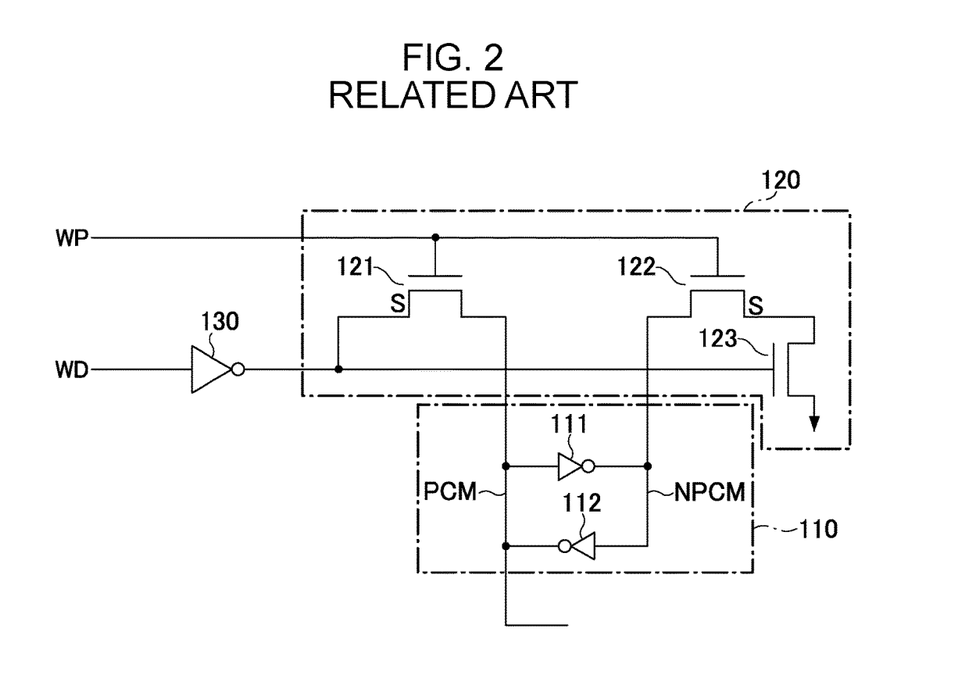
FIG. 2 is a diagram illustrating an example of the configuration of a latch circuit in which a writing section is formed with nMOS logic.

FIG. 2 is a diagram illustrating an example of a memory circuit in which data is written to a latch circuit by a writing section formed with nMOS logic. A writing circuit 120 is a writing section including three nMOS transistors 121, 122, and 123. In the case where the write data WD input to an inverter 130 is written to a latch circuit 110, a memory circuit illustrated in FIG. 2 uses a single control line for transmission of a control signal WP to turn on the nMOS transistors 121 and 122. Specifically, in the case where the writing section is formed with nMOS logic as illustrated in FIG. 2, the number of control lines may be reduced by 1, compared with the case where the writing section is formed with CMOS logic as illustrated in FIG. 1.

Figure 3:
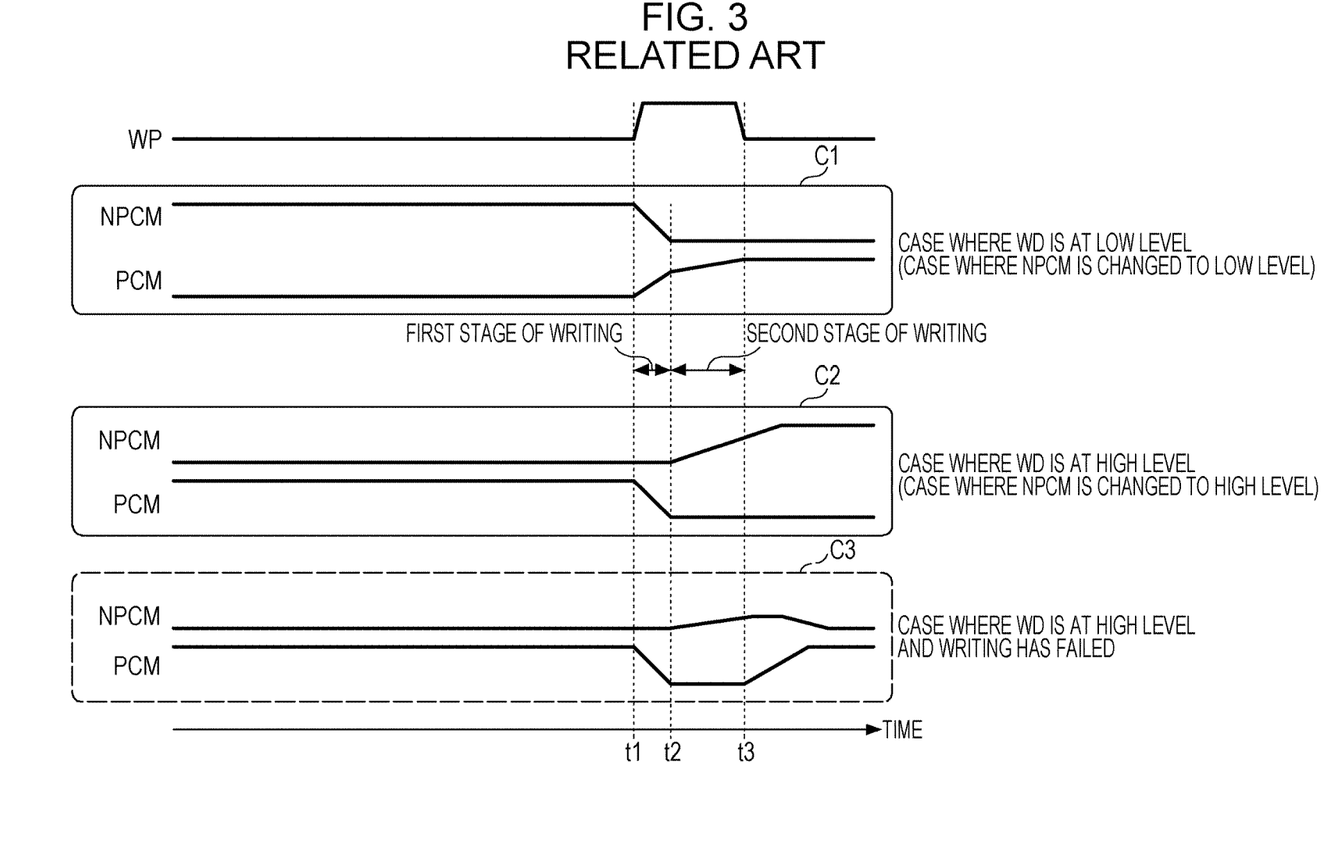
FIG. 3 is a timing chart illustrating an example of a writing operation of the circuit illustrated in FIG. 2.

FIG. 3 is a timing chart illustrating an example of a writing operation of the memory circuit illustrated in FIG. 2.

If the write data WD is at a low level (refer to case C1), a source S of the transistor 121 is at a high level due to the inverter 130. When the source S of the transistor 121 is at the high level, the transistor 123 is in an ON state and a source S of the transistor 122 is at a low level. In this state, when the control signal WP is changed to a high level at time t1, the transistors 121 and 122 are turned on. When the transistors 121 and 122 are turned on, a latch node NPCM is changed to a low level via the transistor 122 in a first stage (at time t2) and a latch node PCM is increased to an intermediate potential via the transistor 121 (at time t2). Since the transistor 121 is an nMOS transistor, the latch node PCM is not increased to a high level (at time t2). Next, in a second stage, the inverter 112 increases the latch node PCM from the intermediate level to the high level due to the change in the level of the latch node NPCM to the low level.

On the other hand, if the write data WD is at a high level (refer to case C2), the source S of the transistor 121 is at a low level due to the inverter 130. When the source S of the transistor 121 is at the low level, the transistor 123 is in an OFF state and the source S of the transistor 122 is high in impedance. In this state, when the control signal WP is changed to the high level at time t1, the transistors 121 and 122 are turned on, and the latch node PCM is changed to a low level via the transistor 121 in the first stage (at time t2). However, since the source S of the transistor 122 is high in impedance, the latch node NPCM is maintained at the low level (at time t2). Next, in the second stage, the inverter 111 increases the latch node NPCM from the low level to a high level due to the change in the level of the latch node PCM to the low level.

As described above, in the second stage, the latch node PCM is increased from the intermediate potential to the high level in case C1, and the latch node NPCM is increased from the low level to the high level in case C2. Thus, a time period for an increase in the level of the latch node NPCM to the high level in case C2 is longer than a time period for an increase in the level of the latch node PCM to the high level in case C1. Thus, at time 3 when the control signal WP is changed from the high level to a low level, the latch node PCM may be determined to be at the high level in case C1, but the latch node NPCM may not be determined to be at the high level in case C2. Specifically, data is hardly written if the write data WD is at the high level, and the balance of the latch circuit is poor, compared with the case where the write data WD is at the low level.

If the writing performance of the latch circuit varies (or the balance is poor) depending on whether the write data WD is at the low level or the high level, the writing may fail depending on manufacturing variations like case C3, and the yield of products may be reduced. Case C3 indicates that the latch node NPCM does not reach the high level at time t3 and is determined to be continuously at the low level, and the latch node PCM is increased to the high level by the inverter 112 again.

The present disclosure provides a memory circuit and a method for controlling a memory circuit, which suppress a deviation in writing performance of a latch circuit.

Hereinafter, embodiments of the memory circuit disclosed herein are described.

Figure 4:
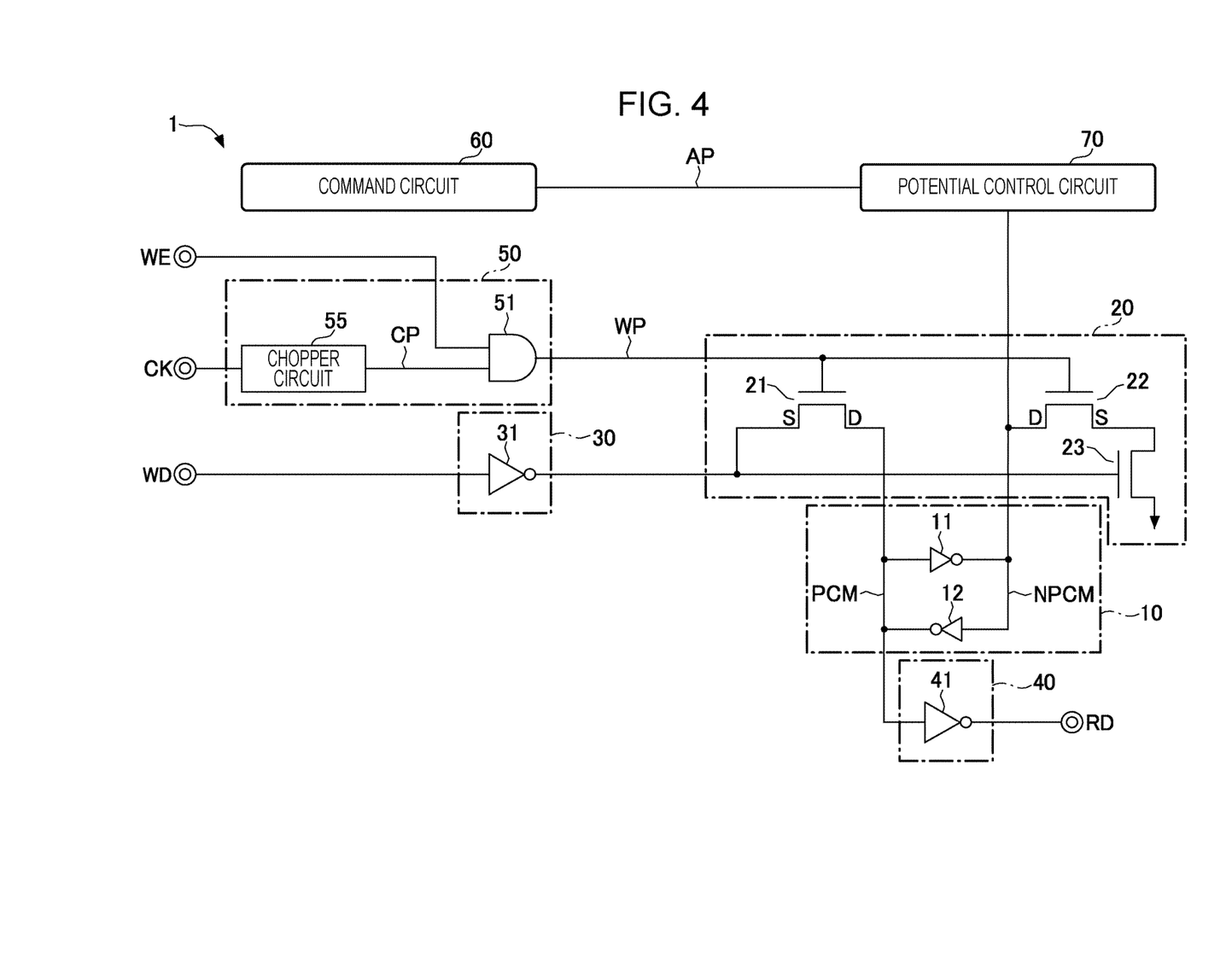
FIG. 4 is a diagram illustrating an example of the configuration of a memory circuit disclosed herein.

FIG. 4 is a diagram illustrating an example of the configuration of the memory circuit disclosed herein. If a write enable signal WE is at an active level, a memory circuit 1 illustrated in FIG. 4 causes write data WD to be input to latch nodes PCM and NPCM of a latch circuit 10 in accordance with a clock signal CK, thereby writing the write data WD to the latch circuit 10. The memory circuit 1 is installed in a semiconductor integrated circuit, for example. The memory circuit 1 includes the latch circuit 10, a writing circuit 20, an input circuit 30, an output circuit 40, a control circuit 50, a command circuit 60, and a potential control circuit 70.

The latch circuit 10 includes the latch node PCM, the latch node NPCM, an inverter 11, and an inverter 12. The latch node PCM is an example of a first node. The latch node NPCM is an example of a second node. The inverter 11 is an example of a first inverter. The inverter 11 is a NOT circuit having an input coupled to the latch node PCM and an output coupled to the latch node NPCM. The inverter 12 is an example of a second inverter. The inverter 12 is a NOT circuit having an input coupled to the latch node NPCM and an output coupled to the latch node PCM. Specific examples of the inverters 11 and 12 are CMOS inverters.

The writing circuit 20 includes transistors 21, 22, and 23 and is an example of a writing circuit that executes writing to the latch circuit 10 using the transistors 21, 22, and 23.

The transistor 21 is an example of a first nMOS transistor coupled to the first node. The transistor 21 has a source S coupled to an output of an inverter 31 of the input circuit 30 and a gate of the transistor 23, a drain D coupled to the latch node PCM, and a gate coupled to an output of an AND circuit 52 of the control circuit 50. A control signal WP is input to the gate of the transistor 21.

The transistor 22 is an example of a second nMOS transistor coupled to the second node. The transistor 22 has a source S coupled to a drain of the transistor 23, a drain D coupled to the latch node NPCM and an output of the potential control circuit 70, and a gate coupled to the output of the AND circuit 52 of the control circuit 50. The control signal WP that is common to the transistor 21 is input to the gate of the transistor 22.

The transistor 23 is an example of a third nMOS transistor. The transistor 23 has the gate coupled to the source S of the transistor 21, the drain coupled to the source S of the transistor 22, and a source coupled to the ground.

The input circuit 30 supplies the write data WD supplied from a write port to the writing circuit 20. The write data WD is an example of data to be written to the latch circuit 10. The input circuit 30 includes the inverter 31 that outputs the write data WD with a logical level obtained by inverting the logical level of the write data WD upon the input of the write data WD to the input circuit 30. The inverter 31 may not be installed depending on the configuration of a circuit coupled to the input circuit 30. The input circuit 30 may include another logical circuit other than the inverter 31.

The output circuit 40 outputs read data RD based on the logical level of the latch node PCM. The read data RD is data read from the latch node PCM of the latch circuit 10. The output circuit 40 includes an inverter 41 that outputs the read data RD with a logical level obtained by inverting the logical level of the latch node PCM. The inverter 41 may not be installed depending on the configuration of a circuit coupled to the output circuit 40. The output circuit 40 may include another logical circuit other than the inverter 41. The output circuit 40 may output the read data RD based on the logical level of the latch node NPCM.

The control circuit 50 is an example of a control circuit that uses the clock signal CK to generate the control signal WP to control the time when the writing circuit 20 executes writing to the latch circuit 10. The clock signal CK is supplied from a clock port. The control circuit 50 includes a chopper circuit 55 and an AND circuit 51, for example.

The chopper circuit 55 uses the clock signal CK to generate a chopper output signal CP with a pulse width narrower than the clock signal CK. For example, the chopper circuit 55 uses the clock signal CK having a duty ratio of 50% to output the chopper output signal CP with the same period as the clock signal CK. The chopper circuit 55 may have a known configuration. The control circuit 50 uses the chopper output signal CP to generate the control signal WP.

Figure 5:
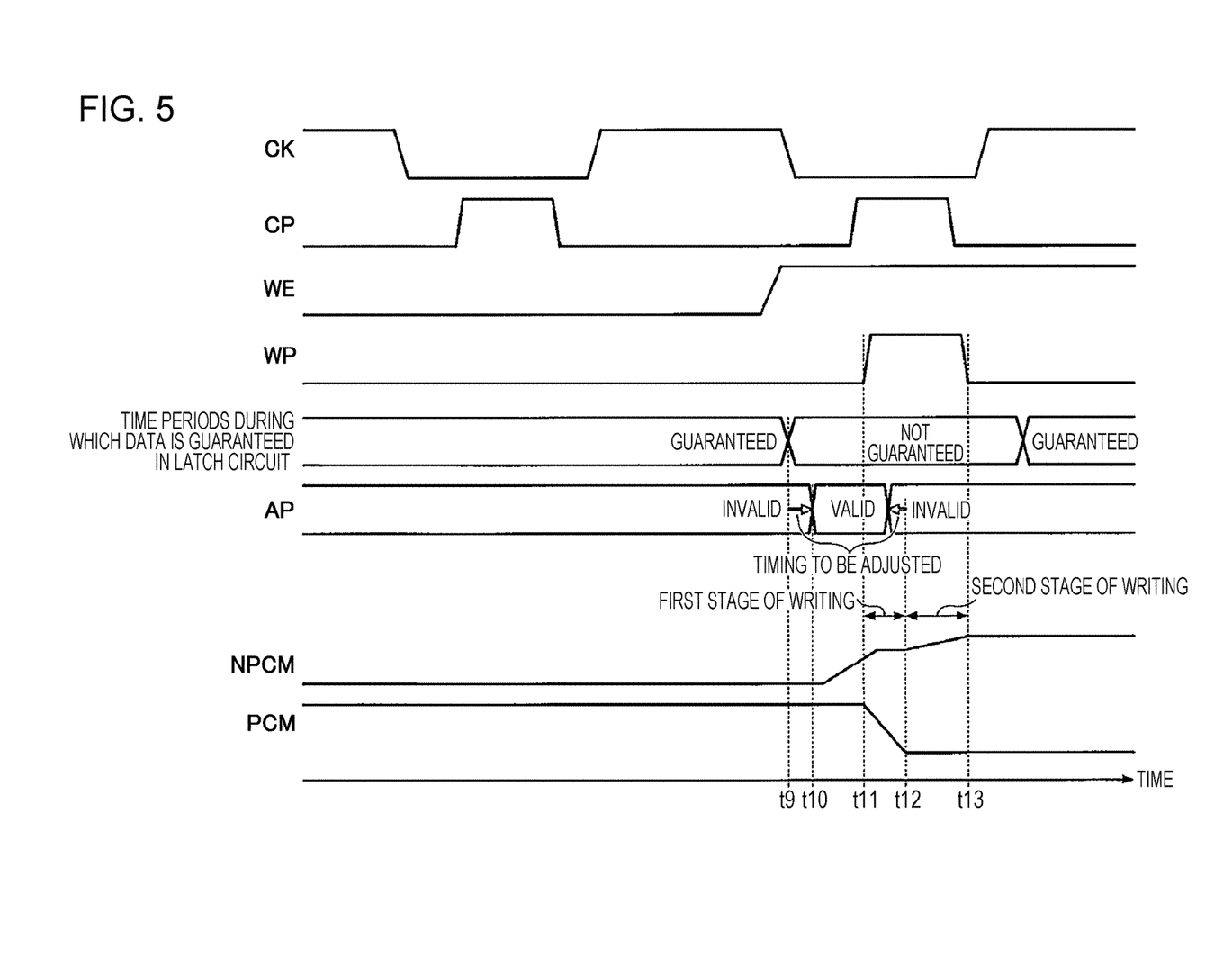
FIG. 5 is a timing chart illustrating an example of a writing operation of the memory circuit disclosed herein.

In the first embodiment, the control circuit 50 includes an AND circuit 51 that uses the chopper output signal CP and the write enable signal WE to output the control signal WP. The write enable signal WE enables an operation of writing to the latch circuit 10. The AND circuit 51 outputs a logical product of the chopper output signal CP and the write enable signal WE. If the logical level of the write enable signal WE is inactive (low level in the first embodiment), the control circuit 50 stops outputting the control signal WP (in other words, the control circuit 50 outputs the control signal WP with a low level as illustrated in FIG. 5). On the other hand, if the logical level of the write enable signal WE and the logical level of the chopper output signal CP are active (high levels in the first embodiment), the control circuit 50 outputs the control signal WP (in other words, the control circuit 50 outputs the control signal WP with a high level as illustrated in FIG. 5).

In the aforementioned configuration illustrated in FIG. 2, in case C1 (refer to FIG. 3) where a high level is written to the latch node PCM, the latch node PCM is increased to an intermediate potential in the first stage. However, in case C2 (refer to FIG. 3) where a high level is written to the latch node NPCM, an operation of increasing the potential of the latch node NPCM is not executed in the first stage. One of the reasons for a deviation in the writing performance of the latch circuit is that the operation of increasing the potential of the latch node NPCM is not executed in the first stage.

To avoid this, the memory circuit 1 according to the first embodiment illustrated in FIG. 4 includes the command circuit 60 and the potential control circuit 70. The command circuit 60 outputs a command signal AP to increase the potential of the latch node NPCM before time t12 when the writing of a low level to the latch node PCM is terminated (refer to FIG. 5). The command circuit 60 uses the clock signal CK to generate the command signal AP, for example. The potential control circuit 70 is a writing support circuit that increases the potential of the latch node NPCM based on the command signal AP, thereby supporting the writing by the writing circuit 20 to the latch circuit 10.

According to the aforementioned configuration, in case C1 where the high level is written to the latch node PCM and case C2 where the high level is written to the latch node NPCM, the potential of the latch node PCM is increased to the intermediate potential in the first stage. Thus, even in case C1 and case C2, since the second stage of the writing operation is started from the intermediate potential, the latch node NPCM may be determined to be at the high level at time t13 when the control signal WP is changed from the high level to the low level. Thus, since the deviation in the writing performance of the latch circuit 10 is suppressed, a variation in the writing performance of the latch circuit 10 may be small and high-yield products may be manufactured, for example.

In addition, as characteristics of each of recent semiconductor devices, the area of a circuit may be efficiently reduced by selecting a circuit topology causing a reduction in the number of lines, instead of selecting a circuit topology causing a reduction in the number of transistors. In this case, the number of control lines included in the memory circuit that is illustrated in FIG. 4 and in which data is written to the latch circuit by the writing section formed with nMOS logic is smaller than the number of control lines included in the memory circuit that is illustrated in FIG. 1 and in which data is written to the latch circuit by the writing section formed with CMOS logic. Thus, the area of the memory circuit may be saved.

Since a p-channel transistor region is separated from an n-channel transistor region in the circuit formed with CMOS logic, a boundary between the regions may be useless. On the other hand, since a p-channel transistor region may be reduced or removed in the circuit formed with nMOS logic, a useless region is reduced and the area of the circuit may be further saved.

The command circuit 60 adjusts the time when the potential of the latch node NPCM is increased. It is preferable that the command circuit 60 output the command signal AP to cause the potential control circuit 70 to increase the potential of the latch node NPCM before time t11 when the writing of the low level to the latch node PCM is started (refer to FIG. 5). Thus, since the first stage is started at time t11 when the potential of the latch node NPCM is higher than 0, it is easy to increase the latch node PCM to a desired intermediate potential in the first stage. Thus, the deviation in the writing performance of the latch circuit 10 may be further suppressed.

In addition, the command circuit 60 detects the execution of the writing to the latch circuit 10 and outputs the command signal AP based on the result of the detection. For example, the command circuit 60 may detect the execution of the writing to the latch circuit 10 (or may detect a writing time period during which the control signal WP is at the high level) in advance when a predetermined time elapses after the detection of a predetermined edge (for example, a falling edge) of the clock signal CK.

The time when the command signal AP is output from the command circuit 60 is adjusted so that time t10 when the potential control circuit 70 starts to increase the potential of the latch node NPCM is not earlier than time t9 when a time period during which data is not guaranteed in the latch circuit 10 is started.

Upon a writing operation by the writing circuit 20, bus fight in which the logical levels of the latch nodes PCM and NPCM are inverted by outputs of the transistors 21 and 22 may occur. It is, therefore, preferable that an output current of the inverter 11 be smaller than an output current from the drain D of the transistor 22 and an output current of the inverter 12 be smaller than an output current from the drain D of the transistor 21.

First Embodiment

Figure 6:
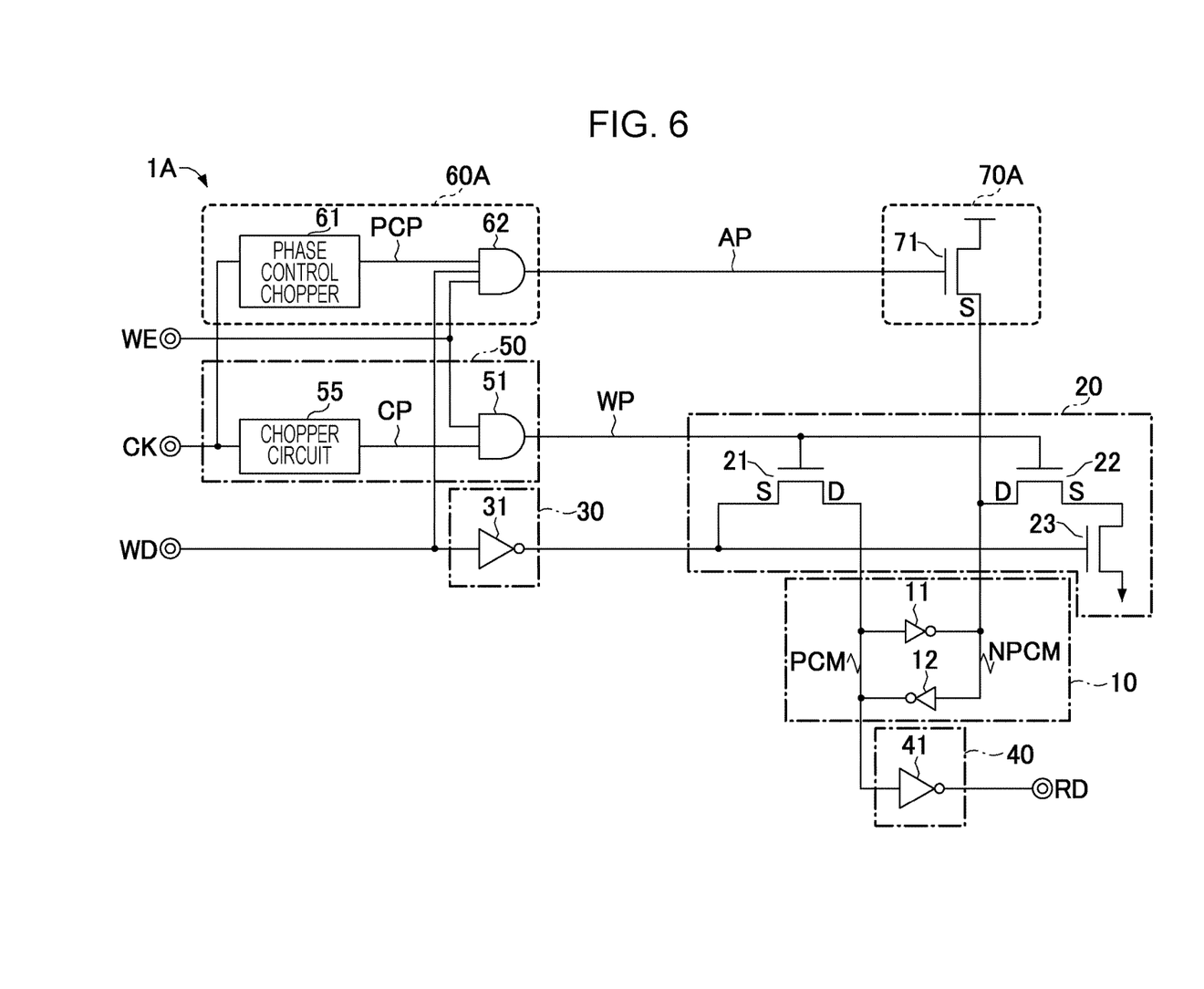
FIG. 6 is a diagram illustrating a first embodiment of the configuration of the memory circuit disclosed herein.
Figure 7:
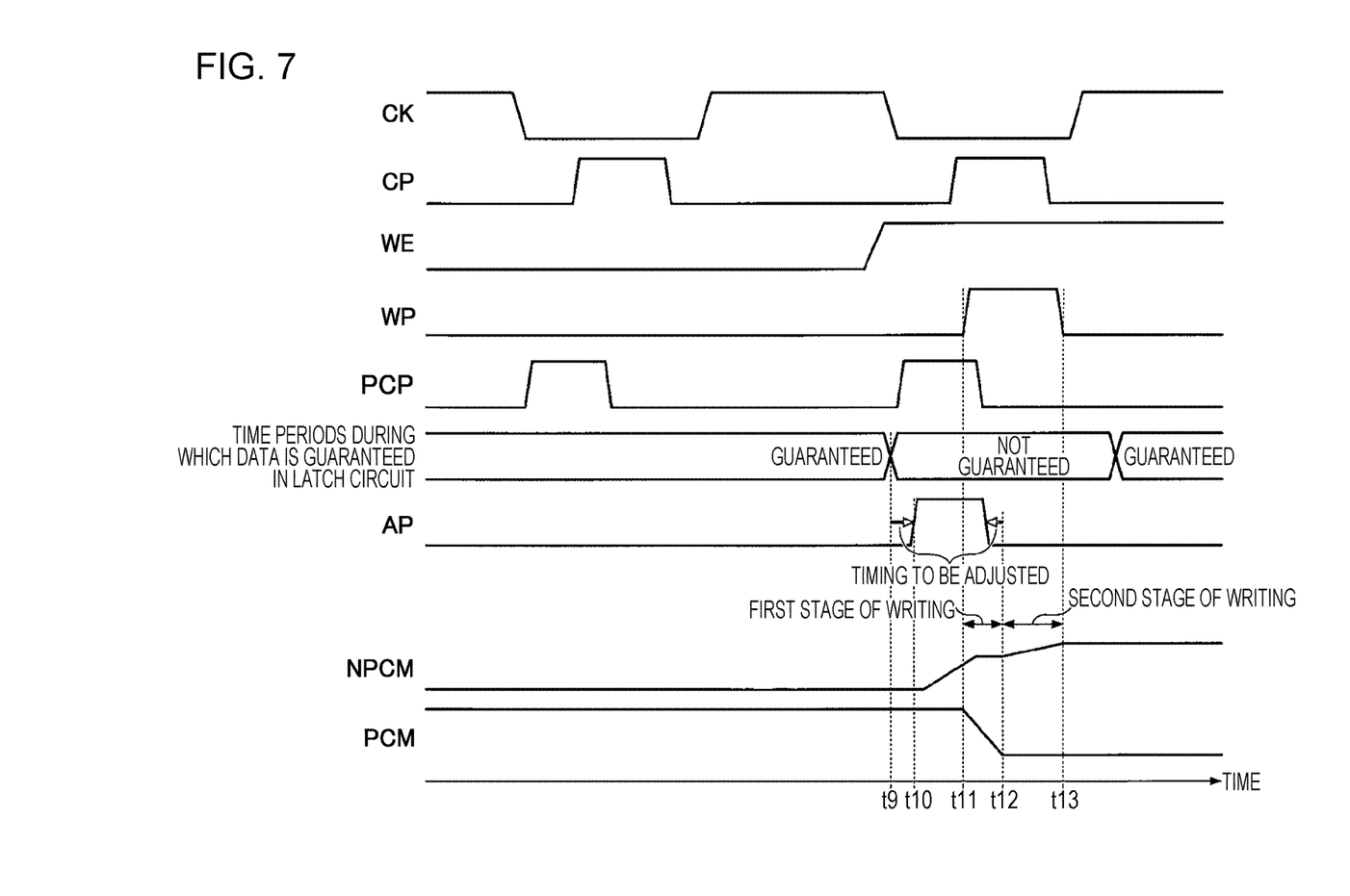
FIG. 7 is a timing chart illustrating an example of a writing operation according to the first embodiment.

FIG. 6 is a diagram illustrating a first embodiment of the configuration of the memory circuit disclosed herein. FIG. 7 is a diagram illustrating an example of operational waveforms of a memory circuit illustrated in FIG. 6. The memory circuit 1A illustrated in FIG. 6 is an example of the memory circuit 1 illustrated in FIG. 4.

If a command circuit 60A detects the execution of the writing of a low level to the latch node NPCM, the command circuit 60A does not output the command signal AP. On the other hand, if the command circuit 60A detects the execution of the writing of a high level to the latch node NPCM, the command circuit 60A outputs the command signal AP (refer to FIG. 7).

If the logical level of the write enable signal WE is inactive (low level in this example), the command circuit 60A does not output the command signal AP. On the other hand, if the logical level of the write enable signal WE is active (high level in this example) and the control clock signal PCP and the write data WD are at high levels, the command circuit 60A outputs the command signal AP.

For example, the command circuit 60A includes a phase control chopper 61 that uses the clock signal CK to generate the control clock signal PCP (refer to FIG. 7) having a phase more advanced than the control signal WP. The phase control chopper 61 is an example of a control clock signal generating circuit. In the first embodiment, the command circuit 60A includes an AND circuit 62 that uses the control clock signal PCP, the write data WD, and the write enable signal WE to generate the command signal AP. The AND circuit 62 outputs, as the command signal AP, a logical product of the control clock signal PCP, the write data WD, and the write enable signal WE.

According to this configuration, even in case C1 where the high level is written to the latch node PCM and case C2 where the high level is written to the latch node NPCM, the latch node PCM is increased to an intermediate potential in the first stage. It is, therefore, possible to suppress the deviation in the writing performance of the latch circuit 10.

In addition, a potential control circuit 70A includes a transistor 71 having a source S coupled to the latch node NPCM. The transistor 71 is an example of a fourth nMOS transistor. When the transistor 71 is turned on based on the command signal AP, the potential control circuit 70A increases the potential of the latch node NPCM. By executing this, it is possible to increase the latch node NPCM to an intermediate potential in the first stage. Specifically, the potential control circuit 70A is a precharge circuit that precharges the latch node NPCM.

The transistor 71 has a gate coupled to an output of the AND circuit 62 of the command circuit 60A, a drain coupled to a power source of the memory circuit 1A, and a source coupled to the latch node NPCM. Since the transistor 71 is an nMOS transistor, the potential control circuit may be reduced in size, compared with the case where a potential control circuit having a pMOS transistor is formed.

Second Embodiment

Figure 8:
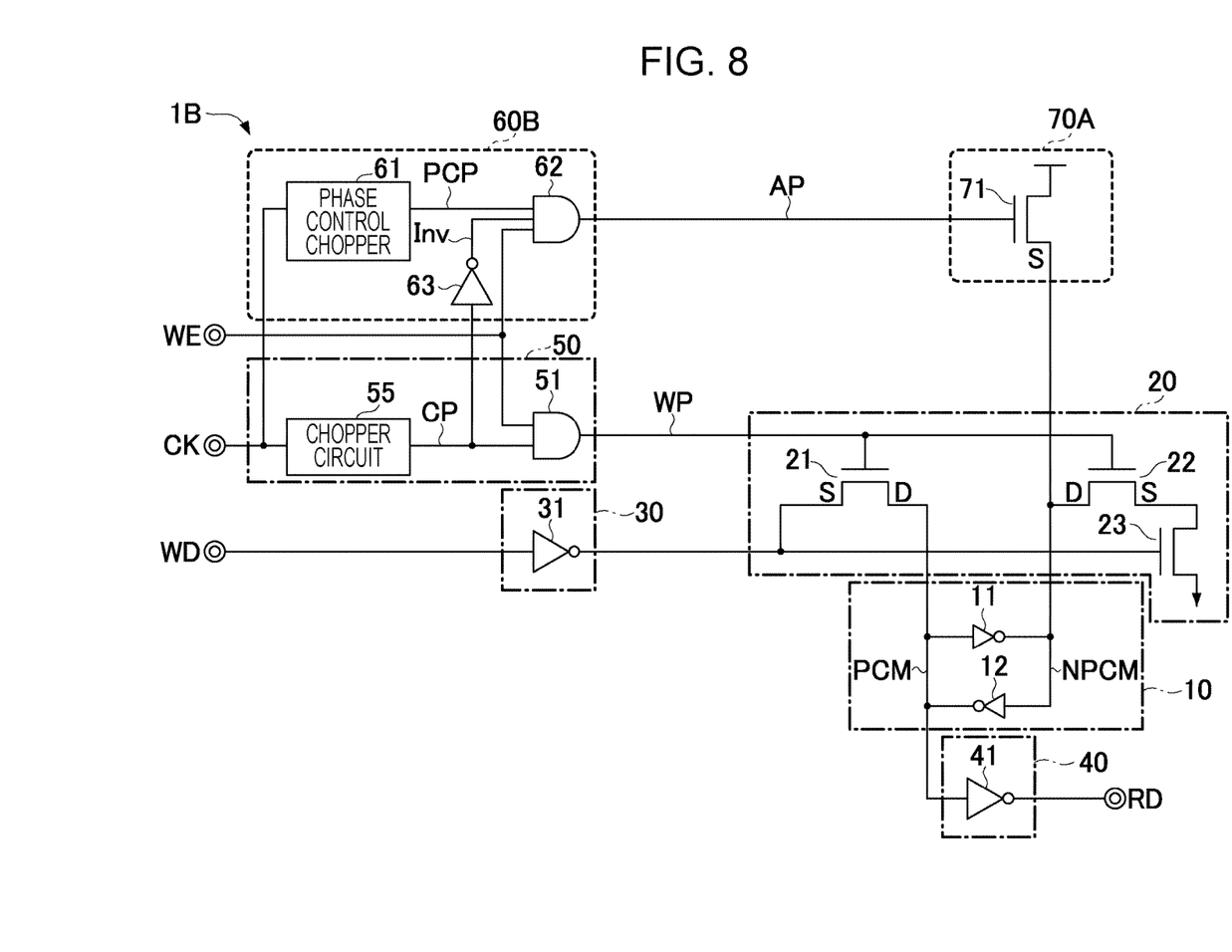
FIG. 8 is a diagram illustrating an example of a second embodiment of the configuration of the memory circuit disclosed herein.
Figure 9:
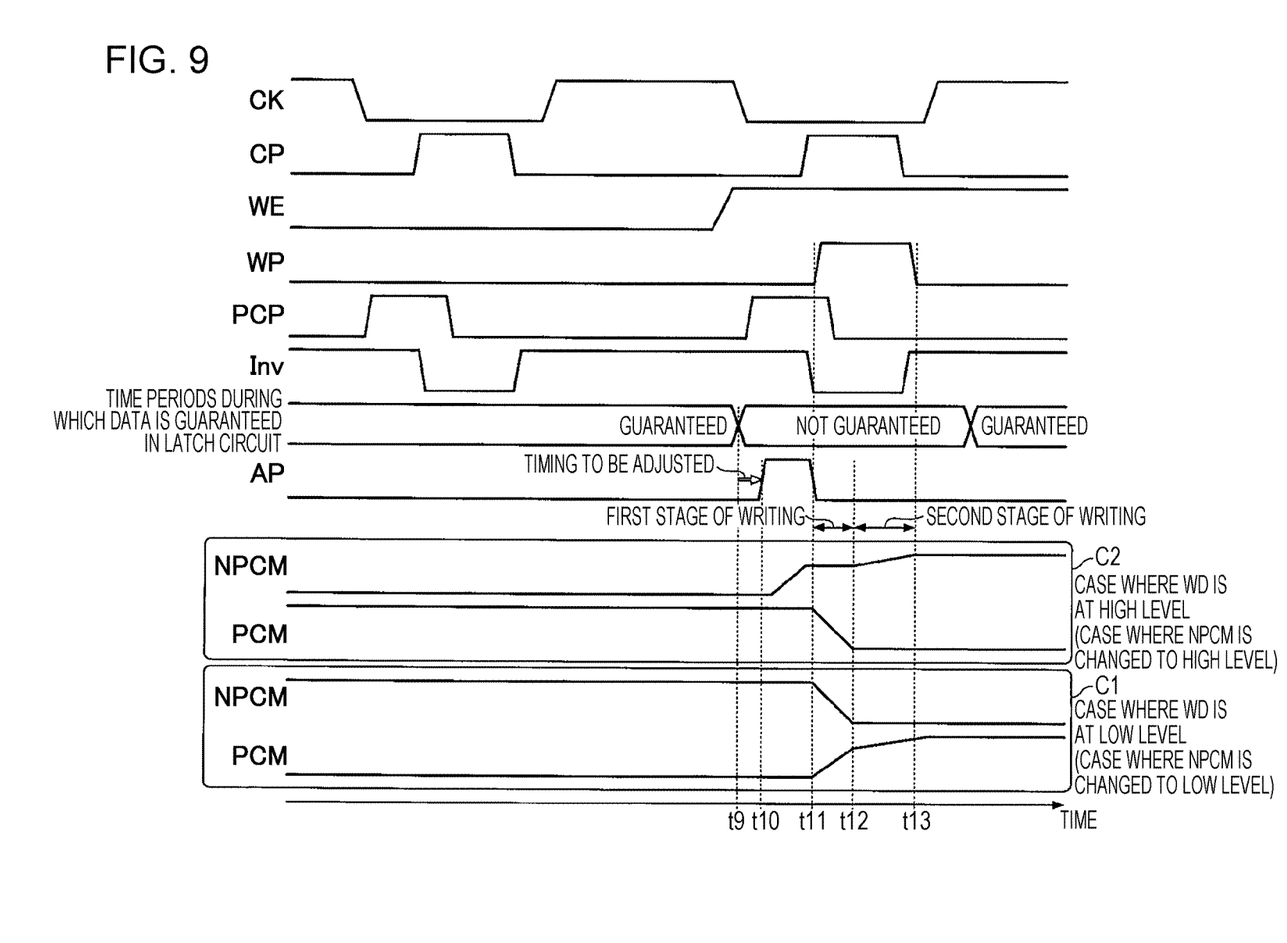
FIG. 9 is a timing chart illustrating an example of a writing operation according to the second embodiment.

FIG. 8 is a diagram illustrating a second embodiment of the memory circuit disclosed herein. In FIG. 8, the timing control by the command circuit according to the first embodiment is simplified. FIG. 9 is a diagram illustrating an example of operational waveforms of a memory circuit illustrated in FIG. 8. The memory circuit 1B illustrated in FIG. 8 is an example of the memory circuit 1 illustrated in FIG. 4.

A command circuit 60B detects the execution of the writing to the latch circuit 10 regardless of whether a logical level written to the latch node NPCM is the high level or the low level. Upon receiving the command signal AP indicating that the execution of the writing has been detected, the potential control circuit 70A starts operating before time t11 when the operation of writing to the latch circuit 10 is started. However, if the potential control circuit 70A operates within a time period for the operation of writing to the latch circuit 10, the inside of the latch circuit 10 becomes short-circuited. Thus, the command circuit 60B stops outputting the command signal AP so that the potential control circuit 70A terminates the operation of increasing the potential of the latch node NPCM before time t11 when the writing of the low level to the latch node PCM is started (refer to FIG. 9).

If the logical level of the write enable signal WE is inactive (low level in this example), the command circuit 60B does not output the command signal AP. On the other hand, if the logical level of the write enable signal WE is active (high level in this example) and the control clock signal PCP and an inverter output signal Inv are at high levels, the command circuit 60B outputs the command signal AP.

For example, the command circuit 60B includes an inverter 63 that outputs the inverter output signal Inv with a logical level obtained by inverting the logical level of the chopper output signal CP. In the second embodiment, the command circuit 60B includes an AND circuit 62 that uses the control clock signal PCP, the inverter output signal Inv, and the write enable signal WE to generate the command signal AP. The AND circuit 62 outputs, as the command signal AP, a logical product of the control clock signal PCP, the inverter output signal Inv, and the write enable signal WE.

In the second embodiment, even in case C2 where the high level is written to the latch node NPCM and case C1 where the low level is written to the latch node NPCM, the command signal AP is output. In case C1, however, since an initial value of the latch node NPCM at time t10 is the high level, the potential control circuit 70A does not actually operate. Thus, the level of the latch node NPCM is changed to the low level by the transistor 22.

Third Embodiment

Figure 10:
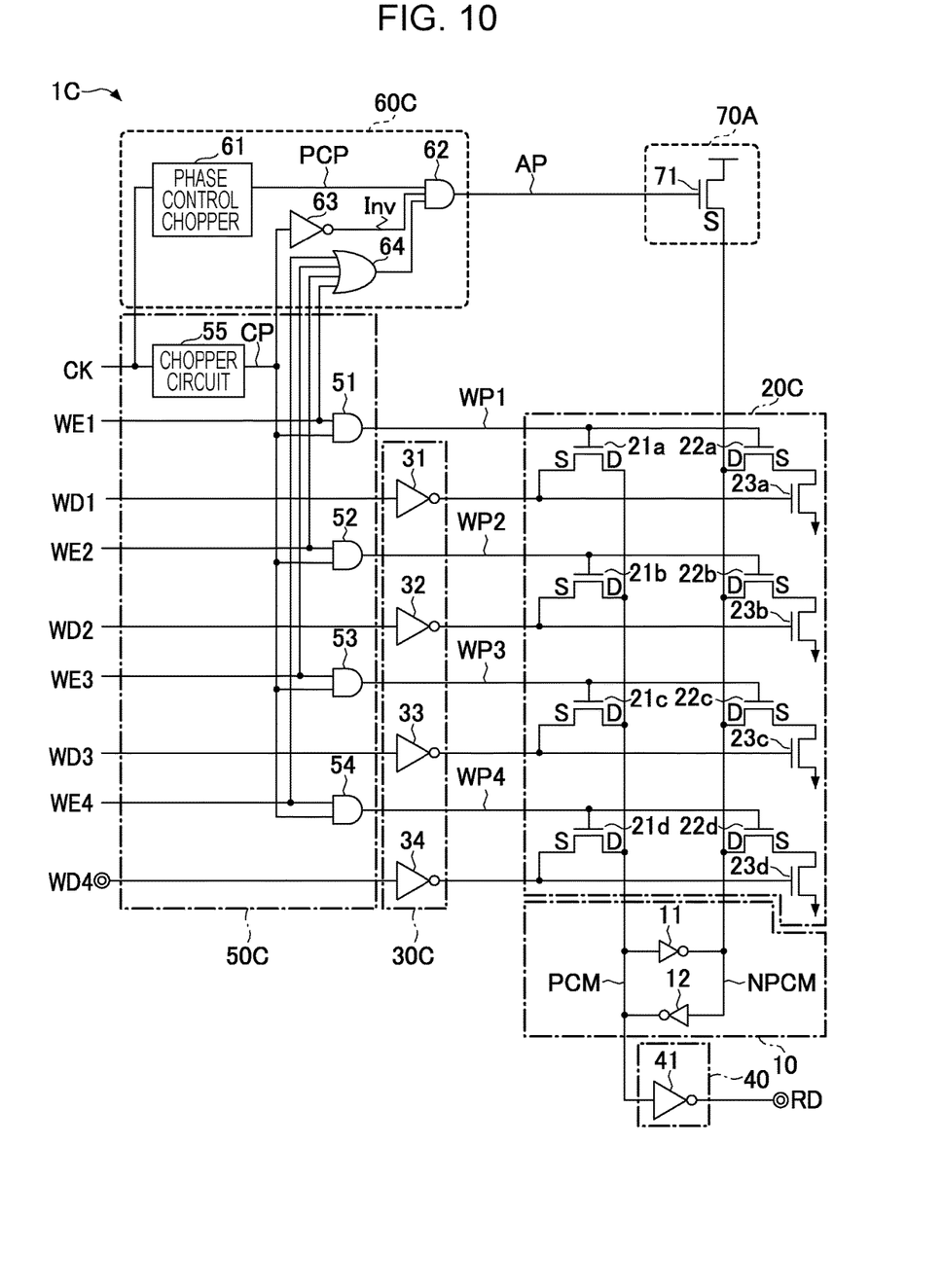
FIG. 10 is a diagram illustrating a third embodiment of the configuration of the memory circuit disclosed herein.

FIG. 10 is a diagram illustrating a third embodiment of the configuration of the memory circuit disclosed herein. A memory circuit 1C illustrated in FIG. 10 is an example of the memory circuit 1 illustrated in FIG. 4. The memory circuit 1C includes a writing circuit group 20C having multiple writing circuits for the single latch circuit 10. The memory circuit 1C writes, to the single latch circuit 10, data that is included in write data WD1, WD2, WD3, and WD4 and permitted by write enable signals WE1, WE2, WE3, and WE4 to be written. The memory circuit 1C includes the latch circuit 10, the writing circuit group 20C, an input circuit 30C, the output circuit 40, a control circuit 50C, a command circuit 60C, and the potential control circuit 70A.

The writing circuit group 20C includes the four first to fourth writing circuits. The first writing circuit includes transistors 21a, 22a, and 23a and writes, to the latch circuit 10, the write data WD1 input to an inverter 31 of the input circuit 30C based on the control signal WP1. The second writing circuit includes transistors 21b, 22b, and 23b and writes, to the latch circuit 10, the write data WD2 input to an inverter 32 of the input circuit 30C based on the control signal WP2. The third writing circuit includes transistors 21c, 22c, and 23c and writes, to the latch circuit 10, the write data WD3 input to an inverter 33 of the input circuit 30C based on the control signal WP3. The fourth writing circuit includes transistors 21d, 22d, and 23d and writes, to the latch circuit 10, the write data WD4 input to an inverter 34 of the input circuit 30C based on the control signal WP4.

The control circuit 50C includes AND circuits 51 to 54. The AND circuit 51 outputs, as the control signal WP1, a logical product of the chopper output signal CP and the write enable signal WE1. The AND circuit 52 outputs, as the control signal WP2, a logical product of the chopper output signal CP and the write enable signal WE2. The AND circuit 53 outputs, as the control signal WP3, a logical product of the chopper output signal CP and the write enable signal WE3. The AND circuit 54 outputs, as the control signal WP4, a logical product of the chopper output signal CP and the write enable signal WE4.

The command circuit 60C includes an OR circuit 64. The OR circuit 64 outputs, as a logical sum output signal, a logical sum of the four write enable signals WE1 to WE4. The command circuit 60C outputs, as the command signal AP, a logical product of the control clock signal PCP, the inverter output signal Inv, and the logical sum output signal of the OR circuit 64.

A basic operation of the latch circuit having a multi-port writing function illustrated in FIG. 10 is the same as that of the latch circuit illustrated in FIG. 2. The command circuit 60C outputs the command signal AP indicating an operation instruction to the potential control circuit 70A based on the results of detecting operations of writing from ports. The potential control circuit 70A increases the potential of the latch node NPCM to an intermediate potential based on the command signal AP.

In the third embodiment, potential control circuits 70A may not be installed for the number of writing ports, it is sufficient if the potential control circuit 70A is installed for a single bit stored in the latch circuit 10, and an effect of an increase in the area of the circuit may be minimized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory circuit comprising:
   a latch circuit that includes a first node, a second node, a first inverter having an input coupled to the first node and an output coupled to the second node, and a second inverter having an input coupled to the second node and an output coupled to the first node;
   a writing circuit that includes a first transistor coupled to the first node and a second transistor coupled to the second node and is configured to execute writing to the latch circuit using the first transistor and the second transistor;
   a command circuit configured to detect the execution of the writing to the latch circuit and output a command signal to increase the potential of the second node before the termination of the writing of a low level to the first node; and
   a potential control circuit configured to increase the potential of the second node based on the command signal,
   the command circuit outputs the command signal to cause the potential control circuit to increase the potential of the second node before the start of the writing of the low level to the first node.

2. The memory circuit according to claim 1, further comprising: a control circuit configured to use a clock signal to generate a control signal to control the time when the writing circuit executes the writing to the latch circuit, wherein the command circuit uses the clock signal to generate the command signal.

3. The memory circuit according to claim 2, wherein the control circuit includes a chopper circuit configured to use the clock signal to generate a chopper output signal with a pulse width narrower than the clock signal and uses the chopper output signal to generate the control signal.

4. The memory circuit according to claim 3, wherein the command circuit includes a control clock signal generating circuit configured to use the clock signal to generate a control clock signal having a phase more advanced than the control signal and uses the control clock signal to generate the command signal.

5. The memory circuit according to claim 4, wherein the command circuit further uses the chopper output signal to generate the command signal.

6. The memory circuit according to claim 4, wherein the command circuit includes an inverter configured to output an inverter output signal with a logical level obtained by inverting the logical level of the chopper output signal and uses the inverter output signal to generate the command signal.

7. The memory circuit according to claim 2, wherein the command circuit further uses data to be written to the latch circuit to generate the command signal.

8. The memory circuit according to claim 1, wherein when the command circuit detects the execution of the writing of a low level to the second node, the command circuit does not output the command signal, and when the command circuit detects the execution of the writing of a high level to the second node, the command circuit outputs the command signal.

9. The memory circuit according to claim 1, wherein the command circuit stops outputting the command signal so that the potential control circuit terminates an operation of increasing the potential of the second node before the start of the writing of the low level to the first node.

10. The memory circuit according to claim 1, wherein the command circuit outputs the command signal if a write enable signal that enables an operation of executing the writing to the latch circuit is active.

11. The memory circuit according to claim 1, wherein the writing circuit includes a third transistor having a gate coupled to a source of the first transistor and a drain coupled to a source of the second transistor, and wherein a drain of the first transistor is coupled to the first node, and a drain of the second transistor is coupled to the second node.

12. The memory circuit according to claim 1, wherein the potential control circuit includes a fourth transistor having a source coupled to the second node and increases the potential of the second node when the fourth transistor is turned on based on the command signal.

13. The memory circuit according to claim 1, wherein an output current of the first inverter is smaller than an output current of the second transistor, and an output current of the second inverter is smaller than an output current of the first transistor.

14. The memory circuit according to claim 1, further comprising: a plurality of writing circuits for the single latch circuit.

15. The memory circuit according to claim 1, wherein the first transistor and the second transistor are nMOS transistors.

16. A control method for a memory circuit including a latch circuit that includes a first node, a second node, a first inverter having an input coupled to the first node and an output coupled to the second node, and a second inverter having an input coupled to the second node and an output coupled to the first node; the control method comprising:
   detecting, by a command circuit in the memory circuit, an execution of a writing to the latch circuit by a first transistor coupled to the first node and a second transistor coupled to the second node;
   outputting, by the command circuit, a command signal to increase a potential of the second node before the termination of the writing of a low level to the first node; and
   increasing, by a potential control circuit in the memory circuit, the potential of the second node based on the command signal,
   the command circuit outputs the command signal to cause the potential control circuit to increase the potential of the second node before the start of the writing of the low level to the first node.

* * * * *